United States Patent [19]

Nakagawa

[11] 4,047,056
[45] Sept. 6, 1977

[54] VOLTAGE-FREQUENCY CONVERTER

[75] Inventor: Kazuyoshi Nakagawa, Yokohama, Japan

[73] Assignee: Honeywell Inc., Minneapolis, Minn.

[21] Appl. No.: 737,989

[22] Filed: Nov. 2, 1976

[51] Int. Cl.² .............................................. H03K 1/16
[52] U.S. Cl. .................................. 307/271; 307/251; 307/261; 328/147
[58] Field of Search ....................... 307/251, 271, 261; 330/69; 328/147

[56] References Cited

U.S. PATENT DOCUMENTS

| 3,749,942 | 7/1973 | Moses | 307/271 |
| 3,835,402 | 9/1974 | Kublick | 307/271 X |
| 3,902,139 | 8/1975 | Harrell | 307/271 X |

Primary Examiner—John S. Heyman
Attorney, Agent, or Firm—Laurence J. Marhoefer; Lockwood D. Burton; Mitchell J. Halista

[57] ABSTRACT

A voltage-frequency converter having an integrator of which the inverted input terminal is supplied a voltage to be converted while its non-inverted input terminal is supplied said voltage through a first switch means and a voltage comparator of which the inverted input terminal is supplied an output voltage of said integrator while its non-inverted input terminal is continuously supplied with a constant voltage and selectively supplied with said voltage to be converted through a second switch means, wherein an output of said voltage comparator is made to control said first and second switch means, whereby said voltage to be converted is converted into a signal having a frequency proportional to said voltage to be converted.

3 Claims, 5 Drawing Figures

VOLTAGE-FREQUENCY CONVERTER

BACKGROUND OF THE INVENTION

1. Field of the Invention

This invention relates to a voltage-frequency converter which converts an input signal into an output signal having a frequency proportional to the voltage of said input signal voltage.

2. Description of the Prior Art

Various proposals have been made thus far with regard to converters of this type. In those prior art devices, there must be prepared a plurality of reference voltage sources and also inverted signal $V_{IN}$ which are produced by inverting an input signal $V_{IN}$, whereby the circuit construction is complicated and uneconomical. Further, the accuracy and reliability thereof are uncertain as a result of fluctuations in the plurality of reference signals.

SUMMARY OF THE INVENTION

An object of the present is to provide an improved voltage-to-frequency converter which obviates the aforesaid prior art problems.

In accomplishing this and other objects, there has been provided, in accordance with the present invention, a voltage-to-frequency converter having an integrator, a compartor, a reference voltage source and switch means wherein an input signal to be converted is supplied to the integrator and the reference input terminal of the comparator through the switch means which are turned on or off by means of the output of said comparator while the output of the integrator is supplied directly to the input signal terminal of the comparator.

BRIEF DESCRIPTION OF THE DRAWINGS

A better understanding of the present invention may be had when the following detailed description is read with reference to the accompanying drawings, in which.

DETAILED DESCRIPTION

Figure 1:
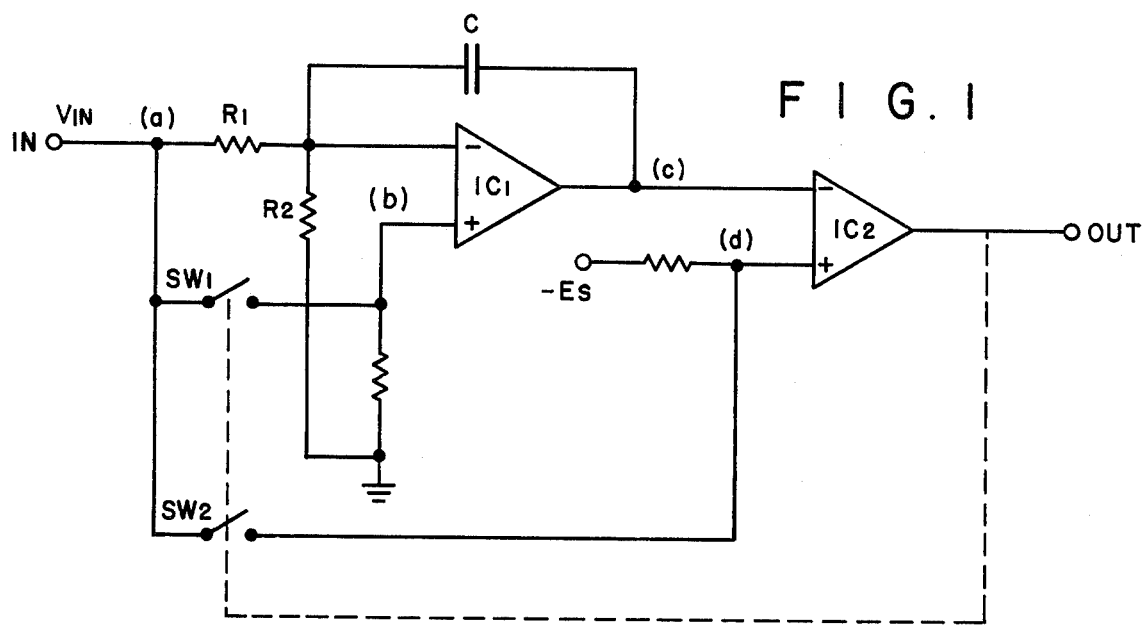
FIG. 1 is a circuit diagram for use in explanation of the principle of the present invention.

FIG. 1 is a circuit diagram used in explaining the operating principle of the present invention. In FIG. 1, a reference character IN designates an input terminal to which a voltage $V_{IN}$ to be converted is applied. $R_1$ and $R_2$ are resistors, $IC_1$ is a differential amplifier, and C is a condenser forming a conventional integrator. Specifically, the inverted input terminal of the amplifier $IC_1$ is connected to the input terminal IN through the resistor $R_1$, while it is also connected to the output terminal of the amplifier through the condenser C, and grounded through the resistor $R_2$. The non-inverted input terminal (reference side) of the differential amplifier $IC_1$ is connected to the input terminal IN through a first switching means which will be explained later. A reference character $IC_2$ designates a voltage comparator, of which the inverted input terminal is supplied the output of the integrator while its non-inverted input terminal is supplied a reference voltage Es and the voltage $V_{IN}$.

The voltage $V_{IN}$ is applied to the comparator $IC_2$ through a second switching means to be described later. Reference characters $SW_1$ and $SW_2$ designate the first and second switching means which are controlled by the output of said comparator $IC_2$ in such manner that they are kept open when the output of the comparator is negative while they are kept closed when it is positive.

Figure 2:
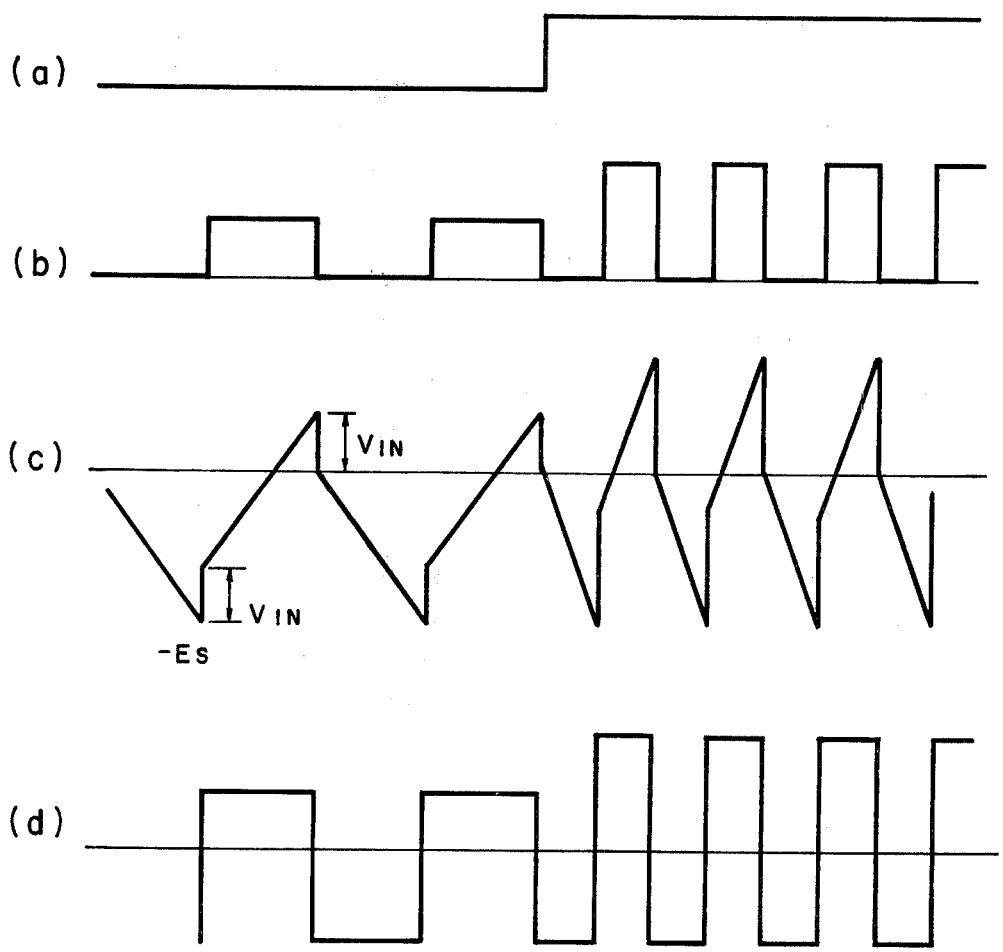
FIG. 2 is a waveform diagram for use in explaining the operation of the circuit shown in FIG. 1.

FIG. 2 is a diagrammatical waveshape representation for use in an explanation of the operation of the circuit shown in FIG. 1, in which (a) shows waveform of the voltage $V_{IN}$, (b) waveform of the voltage which is applied to the non-inverted input terminal of the differential amplifier constituting the integrator, (c) waveform of the voltage at the output terminal of the integrator, and (d) waveform of the voltage applied to the non-inverted input terminal of said comparator $IC_2$.

Referring again to FIG. 1 and assuming that the output of the voltage comparator $IC_2$ is negative, the first and second switches $SW_1$, $SW_2$ are kept open concurrently. The voltage at the junction (b) is 0 V as shown by FIG. 2 (b) while the voltage at another junction (d) is kept at the level of the reference voltage Es as seen from FIG. 2 (d). At this time, a constant current is being supplied into the condenser C via the resistor $R_1$, and the voltage at the output of the amplifier $IC_1$ is decreasing to the negative side as shown in FIG. 2 (c). Assuming that the voltage at the output of the amplifier $IC_1$ has become equal to the reference voltage $-Es$ when the time $T_1$ has passed, the following equation is applicable:

$$T_1 = CR_1 \frac{E_S}{V_{IN}} \tag{1}$$

At this stage in the operation, the output of the comparator $IC_2$ is inverted, and its output signal is made positive which is arranged to close the first and second switches $SW_1$ and $SW_2$. Accordingly, the potentials at points (b) and (d) become equal to $V_{IN}$ as shown in FIGS. 2 (b) and 2 (d). At this time, a constant current flows out of the condenser C through the resistor $R_2$, and the potential at the output terminal of the amplifier $IC_1$ increases positively as seen in FIG. 2 (c). Assuming that this potential at the point (c) becomes $V_{IN}$ when the $T_2$ has passed, the following relation is applicable:

$$T_2 = CR_2 \frac{E_S}{V_{IN}} \tag{2}$$

At this stage, the comparator output signal is inverted again, and its output is made negative which is effective to open the switches $SW_1$ and $SW_2$. In this manner, one cycle of the conversion operation is completed and the initial state of circuit is regained.

Accordingly, the period T is expressed by the following equation (3).

$$T = T_1 + T_2 = C(R_1 + R_2) \frac{E_S}{V_{IN}} \tag{3}$$

or the frequency by the reciprocal, as follows:

(4)

-continued
$$F = \frac{1}{C(R_1 + R_2)} \cdot \frac{1}{E_S} \cdot V_{IN}$$

From the equation (4) above, it is readily understood that the output signal frequency F is made proportional to the voltage $V_{IN}$ which is an input signal.

As seen from the principle explained above, according to the present invention, there is provided a voltage-to-frequency converter which includes the integrator, of which the inverted input terminal is supplied the voltage to be converted while its non-inverted input terminal is supplied the voltage to be converted through the first switch means, and a voltage comparator of which the inverted input terminal is supplied the output voltage of said integrator while its non-inverted input terminal is supplied a constant voltage along with the voltage to be converted through the second switch means with the switch means being operated by the output signal of said comparator, whereby the voltage to be converted is converted into a signal having a frequency proportional to the voltage.

Figure 3:
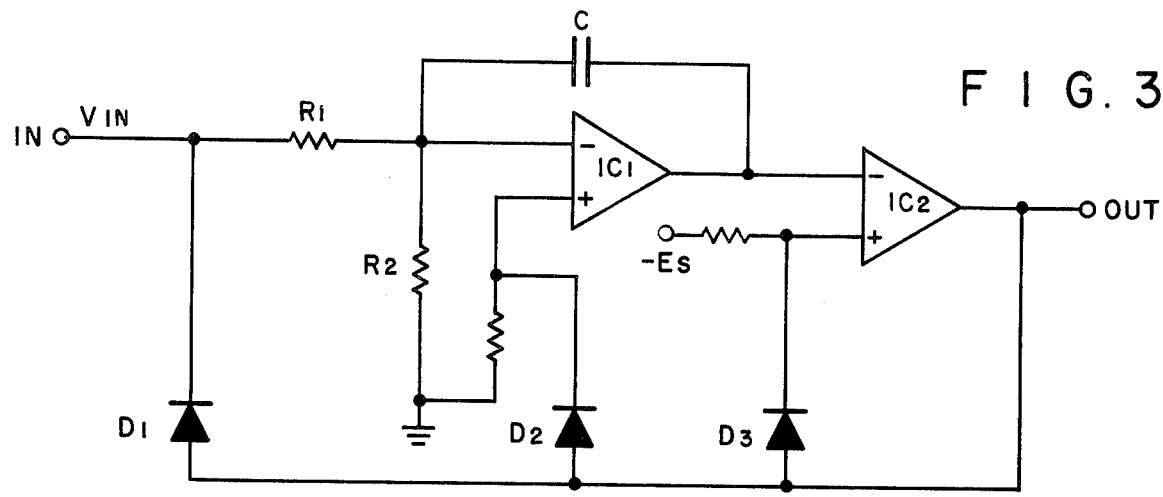
FIG. 3 shows a specific circuit embodiment of the invention.

FIG. 3 is a detailed circuit diagram of a voltage-to-frequency converter embodying the present invention, wherein the first and second switches $SW_1$ and $SW_2$ of FIG. 1 are constituted by diodes. In FIG. 3, like characters are used from FIG. 1 to designate the like or corresponding components of the circuit in FIG. 3. Characters $D_1$, $D_2$ and $D_3$ designate diodes which constitute switching diodes. In the circuit of FIG. 3, when the output of the comparator $IC_2$ is negative, the diodes $D_1$ through $D_3$ are in a blocked state, whereby the potential at the point (b) becomes 0 V while the potential at the point (d) becomes equal to the reference voltage $-E_s$. Vice versa, when the output of the comparator $IC_2$ is positive, all the diodes $D_1$, $D_2$, $D_3$ are biased forwardly to become conductive. At this time, the potentials at points (b) and (d) become equal to $V_{IN}$, whereby the voltage $V_{IN}$ to be converted can be converted into a signal having a frequency proportional to the input voltage $V_{IN}$.

In the FIG. 3 embodiment, an unmatched forward voltage drop of said switching diodes $D_1$, $D_2$ and $D_3$ may be compensated for by means of making ON-time of diodes be longer than OFF-time of the same. Further, by setting the ration between resistors $R_1$ and $R_2$ to be about 100, it is possible to make the influence on the conversion due to the diode characteristics to be negligible. Thus, when the values of resistors $R_1$ and $R_2$ are set so as to satisfy the relation $R_1 > R_2$, and $V_{IN}$(min) is set nearly equal to Es, only a negligible nonlinearity error may be caused by an unmatched forward voltage drop of the switching diodes $D_1$, $D_2$ and $D_3$. With regard to the temperature characteristics of the diodes, the same circuit characteristics as mentioned above are effective. Also, the diodes $D_1$, $D_2$ and $D_3$ are arranged in the circuit so as to compensate one another, so that the influence due to the difference of temperature characteristics is suppressed. This temperature effect would be further improved by making use of an FET (Field Effect Transistor) which is less affected by ambient temperature.

Figure 4:
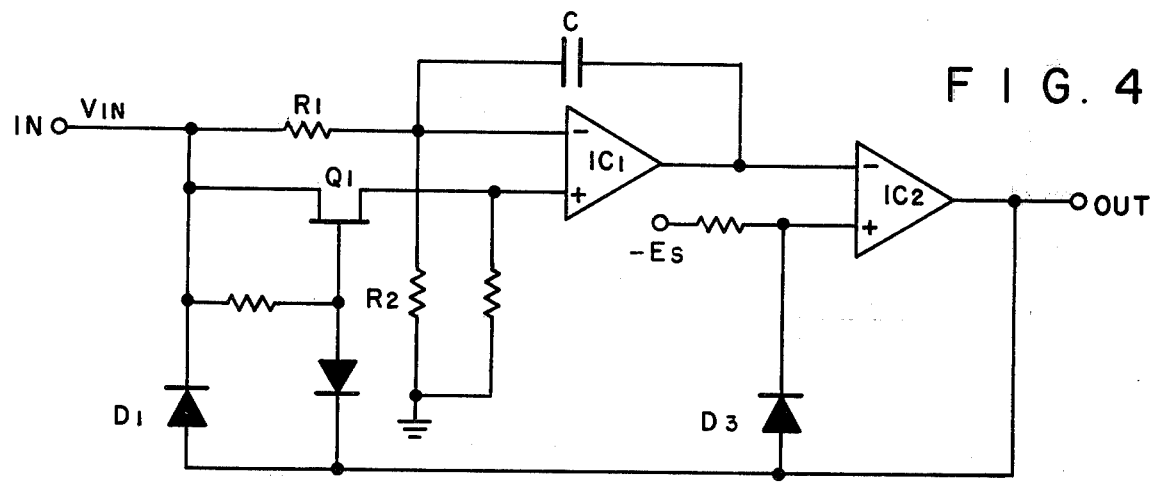
FIGS. 4 and 5 show another specific circuit embodiments of this invention.
Figure 5:
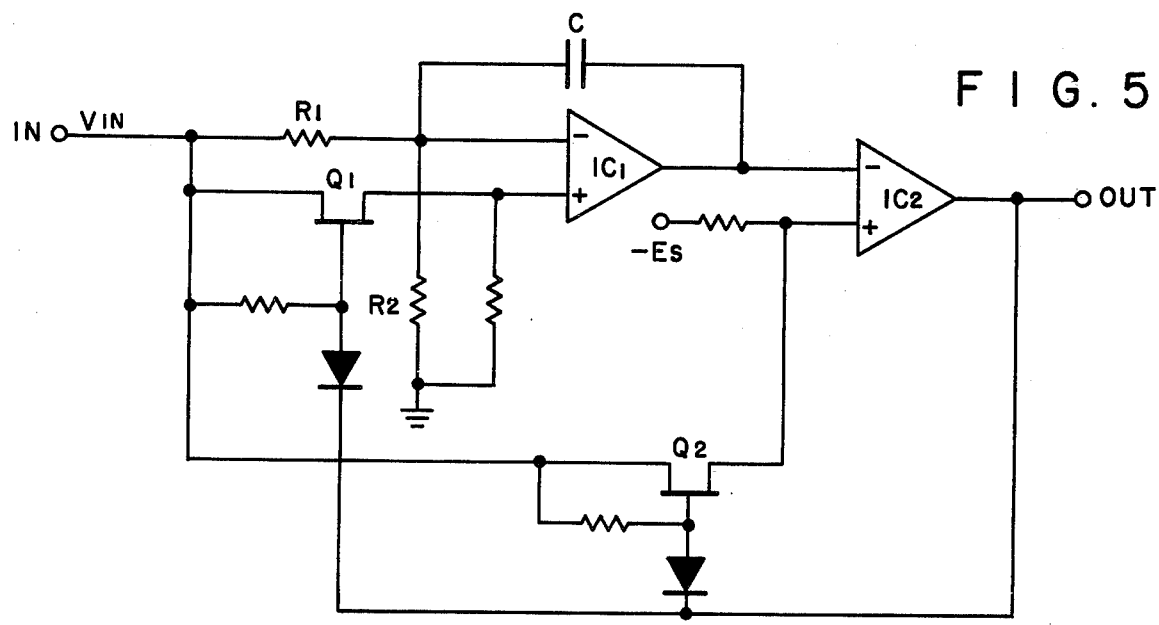

FIGS. 4 and 5 show another embodiment of this invention. In the embodiment using switching diodes, as shown in FIG. 3, it may be necessary, as explained above, to make the ratio between resistors $R_1$ and $R_2$ large to compensate for switching diode characteristics. Consequently, it becomes difficult under those conditions to obtain a large output frequency. In the embodiment shown in FIG. 4, the diode $D_2$ of FIG. 3 is replaced by an FET labeled $Q_1$ in order to overcome the possibility of the problem discussed above. In the embodiment shown in FIG. 5, the diode $D_1$ is eliminated and the diode $D_3$ is also replaced by another FET labeled $Q_2$ in order to further improve the linearity and temperature characteristics of the converter. Like parts in FIGS. 3, 4 and 5 bear like characters. On the other hand, reference character $Q_1$ in FIG. 4 and $Q_1$, $Q_2$ in FIG. 5 designate FET's which are adopted to suppress the aforesaid temperature influence on the circuit operation.

As discussed above, according to this invention, an improved voltage-frequency converter is obtainable with a simple circuit construction and high reliability.

The embodiments of the invention in which an exclusive property or privilege is claimed are defined as follows:

1. A voltage-to-frequency converter comprising
   an integrator having an inverting input terminal and a non-inverting input terminal,
   an input signal terminal,
   circuit means connecting said input signal terminal to said inverting input terminal,
   first switch means connecting said input signal terminal to said non-inverting input terminal,
   a signal comparator having an inverting input terminal and a non-inverting input terminal,
   circuit means connecting an output of said integrator to said inverting input of said comparator,
   reference signal means connected to said non-inverting input of said comparator,
   second switch means connecting said input signal terminal to said non-inverting input of said comparator and
   means connecting an output of said comparator to said first and second switch means to concurrently operate said first and second switch means.

2. A voltage-to-frequency converter as set forth in claim 1 wherein said first and second switching means each include field-effect transistors having their gate electrodes connected to the output of said comparator.

3. A voltage-to-frequency converter as set forth in claim 1 wherein said first and second switching means each include switching diodes connected to the output of said comparator to be biased thereby between a conducting and a non-conducting state.

* * * * *